United States Patent [19]

Franke

[11] 4,337,308
[45] Jun. 29, 1982

[54] PROCESS FOR MAKING RELIEF-TYPE RECORDINGS

[75] Inventor: Werner Franke, Wiesbaden, Fed. Rep. of Germany

[73] Assignee: Hoechst Aktiengesellschaft, Fed. Rep. of Germany

[21] Appl. No.: 73,473

[22] Filed: Sep. 7, 1979

Related U.S. Application Data

[63] Continuation of Ser. No. 863,421, Dec. 22, 1977, abandoned.

[30] Foreign Application Priority Data

Dec. 23, 1976 [DE] Fed. Rep. of Germany ....... 2658422

[51] Int. Cl.³ .............................................. G03C 5/00
[52] U.S. Cl. .................................... 430/306; 430/258; 430/313; 430/323; 430/324; 430/325; 430/330; 430/502; 430/935
[58] Field of Search ............... 430/253, 258, 306, 313, 430/323, 324, 325, 330, 502, 935

[56] References Cited

U.S. PATENT DOCUMENTS

| | | | |
|---|---|---|---|
| 2,993,789 | 7/1961 | Crawford | 430/281 |
| 3,157,505 | 11/1964 | Nutley | 96/35.1 X |
| 3,469,982 | 9/1969 | Celeste | 96/35.1 |
| 3,615,435 | 10/1971 | Chu et al. | 96/28 |
| 3,770,438 | 11/1973 | Celeste | 96/28 X |
| 3,785,817 | 1/1974 | Kuchta | 96/28 |
| 3,982,943 | 9/1976 | Feng et al. | 96/68 X |
| 4,050,936 | 9/1977 | Takeda et al. | 96/28 |

FOREIGN PATENT DOCUMENTS 1906668 11/1973 Fed. Rep. of Germany.

*Primary Examiner*—Mary F. Downey
*Attorney, Agent, or Firm*—James E. Bryan

[57] ABSTRACT

This invention relates to an improvement in a process for making relief-type recordings, in which a layer transfer material comprising a solid photopolymerizable layer on a flexible temporary layer support, is applied to a permanent layer support in such a manner that the photopolymerizable layer is firmly bonded to the latter, the photopolymerizable layer adhering to the permanent layer support is then imagewise exposed, with the temporary layer support being removed before or after exposure, the unexposed layer areas are washed away with a developer, and the surface areas of the permanent support bared by washing are modified by etching or depositing a metal, if required, the improvement which comprises using a photopolymerizable layer which is composed of at least two photopolymerizable partial layers of different compositions.

5 Claims, No Drawings

PROCESS FOR MAKING RELIEF-TYPE RECORDINGS

This is a continuation, of application Ser. No. 863,421, filed Dec. 22, 1977 now abandoned.

This invention relates to a process for making relief-type recordings using a layer transfer material or a dry resist laminate, comprising a temporary film support, a photopolymerizable layer and, if required, a cover film which may be peeled off.

From U.S. Pat. No. 3,469,982, a dry resist laminate is known which is composed of a uniform photopolymerizable layer placed between two films (temporary film support and cover film). After removing the cover film, the photopolymerizable layer is laminated to a permanent layer support, usually copper. In order to ensure separation of the films at the desired surface of the photopolymerizable layer, a difference in adhesion of the photopolymerizable layer to the cover film and to the film support must be provided for, and this is achieved by using different films.

It is known (German Auslegeschrift No. 1,140,080; U.S. Pat. No. 2,993,789) to build up photopolymerizable layers from partial layers having high and low sensitivities to radiation and to apply additional protective and anchoring layers which are insensitive to light. But this refers to layers which, in use, remain firmly bonded to the permanent substrate (preferably metal), i.e. on printing plates. The application of this laminated material is entirely different from that of the dry resist laminate, in which preferably both films must be separated from the photopolymerizable layer prior to final processing.

From German Auslegeschrift No. 1,906,668, a photopolymerizable recording material is known which is used to form images by transfer in heat and the photopolymerizable layer of which is composed of two partial layers of different compositions.

Further, a dry resist laminate is known (German Offenlegungsschrift No. 2,450,380) which is composed of two layers of different compositions placed between films, the two layers comprising a layer insensitive to light and a light-sensitive layer. By this arrangement it is possible to prepare thicker, positive-working dry resist laminates having an adequate sensitivity to light. However, when the material is processed the second layer which is insensitive to light will give rise to disadvantages, i.e. to substantial undercuttings. This structure of the layer has proved to be complicated and difficult to fabricate technically.

The above-described structure of negative dry resist laminates comprising a single layer results in the following difficulties and disadvantages:

As the properties of the photopolymerizable substance are identical on all sides, desired differences in properties on the upper and undersides of the layer, e.g., a difference in adhesion necessarily must be effected by the properties of the film or metal surfaces interacting with the photopolymerizable layer. This means that, e.g., the films enclosing the photopolymerizable layer not only should have special properties which can be achieved only incompletely, in view of transparency, light transmission, dimensional stability, flexibility or rigidity, but they also should show specific effects in view of the adhesive forces relative to the layer, so that, naturally, the number of suitable film types is considerably limited.

The photopolymerizable layer should meet requirements which are hardly compatible with one another, e.g., it should not be too soft, in order to prevent squeezing out of the layer at the cut edges of the rolled up films and to avoid pressure marks; it should not be too tacky in order to avoid clinging of the cover film during peeling off of the film and to avoid trapping of dirt particles from the air, which may give rise to the formation of holes in printed circuits; and it should be sufficiently flexible in order to prevent chipping off of particles from the photopolymerized layer. It is, therefore, difficult to find photopolymer layers having these properties.

It is further a disadvantage of the uniform structure of the photopolymerizable layer that it is impossible to adapt the resistance of the resist image to the chemical and mechanical attacks which are different in the various layer areas of depths, during electroplating. In the electroplating bath during nickel and/or gold plating mechanical forces may, e.g., occur in the lower areas of the layer close to the support surface, which necessitate a particularly strong and tough layer in this area only.

In addition, different layer components coming into contact with one another may have adverse effects, if these components chemically or physically interact, which often becomes apparent only after an extended storage time. In this connection dyes and dyed substances may be mentioned which, e.g., serve to make visible the imagewise exposure prior to processing the photopolymerizable layer, or dyes used as marking colors, and substances which by their light-absorbing property have a regulating effect upon an excessive sensitivity to light of the layer, or substances which prevent an undesired light scatter.

It is, therefore, an object of the invention to provide a process for making relief-type recordings using a dry resist laminate which does not have the above-described disadvantages and which, in its photopolymerizable layer, may contain substances which normally cannot be employed together.

The invention is based on a process for making relief-type recordings, in which a layer transfer material comprising a solid photopolymerizable layer on a flexible temporary layer support is applied to a permanent layer support in such a manner that the photopolymerizable layer is firmly bonded to the latter; the photopolymerizable layer adhering to the permanent layer support is then imagewise exposed, with the temporary layer support being removed before or after exposure; the unexposed layer areas are washed away with a developer, and the surface areas of the permanent support bared by washing are modified by etching or depositing a metal, if required. A photopolymerizable layer is used which comprises at least two photopolymerizable partial layers of different compositions.

As a result, properties such as a different surface adhesion now can be easily taken on by partial layers of the photopolymerizable layer. Thus, a greater number of photopolymerizable materials may be offered. Finally, it is possible to adapt the partial layers especially to an increased resistance in particular layer areas.

In addition, the arrangement according to the invention largely prevents the contact of components which, in a single layer, chemically and physically interact in an undesirable manner.

As a temporary layer support a thin, flexible, smooth transparent plastic film is used, as described in U.S. Pat. No. 3,469,982. Polyester films, in particular biaxially stretched films of polyethylene terephthalate are the most appropriate.

As a cover film which is applied to the polymerizable layer by pressing-on or coating, any covering flexible material may be used, provided it has an adhesion to the photopolymerizable layer which is lower than the corresponding adhesion of the support film. In practice, a polyolefin film is, therefore, used as a cover film, in particular a polyethylene film. However, the invention makes it possible to use a cover film of the same material as used for the film support, so that the two films have an identical adhesion. Contrary to the polyolefins hitherto used, polyester films which are free from specks and are dimensionally stable thus can be employed as cover films.

The photopolymerizable layer substantially comprises at least one ethylenically unsaturated polymerizable composition, a photoinitiator, a polymeric inert binder and one or more dyes, if required.

Adhesion promoting agents may be added to the layers in order to improve their stability in Ni/Au electroplating baths.

Suitable photopolymerizable layers are, e.g., described in German Offenlegungsschriften Nos. 2,064,079 and 2,361,041.

As the photopolymerizable layer is built up of partial layers, it is possible to prepare negative dry resist laminates which have a very thick, uniformly dried photopolymerizable layer and which, in addition, yield different desired properties in the partial layers by a combination of various components. Preferably, the photopolymerizable layer adjacent the cover film contains an adhesion promoting agent. This will result in an increased adhesion of the photopolymerized layers to the permanent substrate during processing.

In a further embodiment of the invention the photopolymerizable layer contains a dye in at least one partial layer. Thus, the coloration of the layer can be controlled without causing undesired chemical or physical interactions with other added substances.

Due to the novel structure of the layer, it is possible to eliminate any unevenness of the photopolymerizable layer by a corresponding combination of the layers. This is particularly useful when building up thick layers on relatively thin temporary film supports.

Appropriately, the dry resist laminate is prepared by continuously depositing the photopolymerizable partial layers on the temporary film support, i.e. by successively applying solutions and drying after each coating operation.

By using the same or a different solvent for each successive coating, a further variation is possible to the effect that the partial layers have a boundary area at their surfaces which either shows a uniform transition zone, when the same solvent has been used for dissolving, or which may result in a second zone which is entirely separate from the first coating, when the dried surface has not been softened due to using a mild solvent. It is also possible to produce corresponding transitional stages between these extreme conditions.

As compared to the known wet-on-wet application, the described coating process has the advantage that thick and well dried layers now can be prepared which have an excellent coating quality.

It is important that the solvent be allowed to evaporate following application of the first coating solution and before a second coating solution is applied.

Any known application means employed for the application of solutions to support surfaces and for drying these surfaces are suitable for coating; for example devices with roller application or spray devices and radiation dryers.

Preferably, the application means are slot dies, and as drying means jet dryers are used.

The invention will be further illustrated by reference to the following specific examples:

EXAMPLE 1

A photopolymerizable stratum which is 30 $\mu$m thick after drying is applied to a 23 $\mu$m thick polyester film. Then, a further 30 $\mu$m thick photopolymerizable stratum is applied at a second coating station of the coating machine, and is then dried and laminated with a polyolefin cover film of 23 $\mu$m thickness. The double layer which is dried to be free from any solvent residue is of a uniform quality and does not exhibit any irregularities. It does not have any streaky thickened areas and sags which occur when the relatively thin 23 $\mu$m polyester film is coated in a single coating operation with the comparatively heavy 60 $\mu$m layer. The strata comprise the following components:

173 g of a reaction product of 1 mole of 2,2,4-trimethyl hexamethylene diisocyanate and 2 moles of hydroxy ethyl methacrylate, 200 g of a terpolymer of n-hexyl methacrylate, methacrylic acid and styrene, 6.1 g of 9-phenylacridine, 0.4 g of Michler's ketone, 4.6 g of triethylene glycol dimethacrylate and 1.0 g of a blue azo dye obtained by coupling 2,4-dinitro-6-chloro-benzene diazonium salt with 2-methoxy-5-acetylamino-N-cyano ethyl-N-hydroxy ethyl aniline.

EXAMPLE 2

To a 25 $\mu$m thick stratum of the composition described in Example 1 a second stratum of 15 $\mu$m thickness is applied in a continuous process, which second stratum contains 0.6 percent by weight of 3-mercaptopropionic acid anilide, relative to the solid contents. The layer is dried at 130° C. and provided with a cover film, as described in Example 1. The thinner photopolymer stratum which immediately contacts the metal when the material is laminated to metal surfaces has a special resistance to detaching phenomena during the building up of Ni/Au layers in electroplating baths.

EXAMPLE 3

A 15 $\mu$m thick dry stratum which has the composition described in Example 1 and is applied to a 23 $\mu$m thick polyester film web is coated with a 20 $\mu$m thick stratum of the composition given below, so that a photopolymerizable double layer is obtained.

The stratum comprises 240 g of the photomonomer described in Example 1, 300 g of a terpolymer of methyl methacrylate, n-hexyl methacrylate and methacrylic acid, 8.6 g of 9-phenyl-acridine, 0.8 g of Michler's ketone, 6.4 g of triethylene glycol dimethacrylate and 2.6 g of the dye specified in Example 1.

The double layer has a considerably improved adhesion to copper-metallized surfaces as compared to the first stratum alone. This is shown by the following experiment:

When a pattern of crossing lines is scratch-marked on the double layer, virtually no portions of the layer may be torn off from the metal surface by means of an adhesive tape which is sensitive to pressure. In a similar experiment on a corresponding material to which the first stratum only has been applied, considerable portions of the layer are torn off with the adhesive tape.

EXAMPLE 4

A 15 μm thick photopolymer stratum (stratum I) was applied to a polyester support film. The dried stratum was covered with a 20 μm thick stratum comprising the components described in Example 1. Finally, a third 15 μm thick stratum (stratum III) was applied in a continuous manner at a third coating station.

Strata I and III were composed of 18 g of a copolymer of methyl methacrylate and methacrylic acid, 15 g of polymethyl methacrylate (MG 258 000), 8 g of a mixture of triethylene glycol dicaproate and triethylene glycol dicaprylate, 34 g of trimethylol propane triacrylate and 13 g of a terpolymer of ethyl acrylate, methyl methacrylate and acrylic acid, 1 g of Michler's ketone and 2 g of 9-phenylacridine.

The photopolymer laminate obtained had good evenness and a good adhesion after laminating to copper surfaces, and it did not have an undesired brittleness.

EXAMPLE 5

A 25 μm thick dry stratum which has a composition according to Example 1 and is applied to a polyester film, is coated with a 20 μm thick stratum of the composition given in Example 4 for stratum III; a layer is obtained which has an increased resistance in Ni/Au electroplating baths while, at the same time, maintaining a high light sensitivity produced by the thicker stratum.

EXAMPLE 6

A photopolymerizable stratum of a composition as specified in Example 1 and applied to a polyester support is coated with a stratum of the composition given in Example 4 for stratum III.

Another polyester support film is coated with the same strata, however, reversed in order.

In this manner, photopolymerizable layer combinations are optionally obtained, the sides of which form angles with the substrate surface, which may be varied so as to yield an obtuse-angled or an acute-angled shape.

As a result it is possible to influence the shape of the metal web of the circuit path during subsequent electroplating or during etching.

EXAMPLE 7

By combining a blue-dyed stratum of a composition in accordance with Example 1 with a stratum of the composition according to Example 1 but with the quantitative relationship modified as follows: 200 g of the photomonomer described in Example 1 and 200 g of the terpolymer described in Example 1, and dyed red using Rhodamine B instead of the blue dye, a red-violet photopolymer material is obtained which by transmitted light differs from the coloration of the individual strata and which has a good transparency and yields a good contrast to copper.

It will be obvious to those skilled in the art that many modifications may be made within the scope of the present invention without departing from the spirit thereof, and the invention includes all such modifications.

What is claimed is:

1. In a process for making relief-type recordings, in which a layer transfer material consisting substantially of a solid photopolymerizable layer deposited on a flexible temporary layer support and having a peelable cover film on the side away from the temporary layer support, is applied to a permanent layer support in such a manner that the photopolymerizable layer, after removing the peelable cover film, is firmly bonded thereto, the photopolymerizable layer adhering to the permanent layer support is then imagewise exposed, with the temporary layer support being removed from the photopolymerizable layer before or after exposure, the unexposed layer areas are washed away from the permanent support with a developer, and the surface areas of the permanent support bared by washing are modified by etching or depositing a metal, if required, the improvement wherein the photopolymerizable layer comprises at least two photopolymerizable layers formed by continuously depositing at least two photopolymerizable partial layers of different compositions on the flexible temporary layer support by:
   (a) applying a first coating solution of a photopolymerizable composition to said flexible temporary layer support,
   (b) drying said first coating solution to obtain a dry photopolymerizable partial layer on said flexible temporary layer support,
   (c) thereafter applying a second coating solution of a different photopolymerizable composition to the surface of said dry photopolymerizable partial layer, and
   (d) drying said second coating solution to obtain another dry photopolymerizable partial layer on said flexible temporary layer support,
   and, if desired, repeating steps (c) and (d) at least once.

2. A process in accordance with claim 1 in which the photopolymerizable partial layer away from the temporary layer support includes an adhesion promoting agent.

3. A process in accordance with claim 1 in which at least one photopolymerizable partial layer contains a dye.

4. A process in accordance with claim 1 in which the cover film is made of the same material as the temporary layer support.

5. A process in accordance with claim 1 in which the photopolymerizable layer is applied to the permanent layer support by the application of pressure and heat.

* * * * *